United States Patent [19]
Peterson, Jr. et al.

[11] Patent Number: 4,935,646
[45] Date of Patent: Jun. 19, 1990

[54] FULLY STATIC CMOS CASCODE VOLTAGE SWITCH LOGIC SYSTEMS

[75] Inventors: Charles W. Peterson, Jr., Herndon; Steven J. Quinlan, Arlington, both of Va.

[73] Assignee: International Business Machines Corporation, Armonk, N.Y.

[21] Appl. No.: 314,525

[22] Filed: Feb. 22, 1989

[51] Int. Cl.$^5$ .................. H03K 17/16; H03K 19/094
[52] U.S. Cl. .................................. 307/443; 307/449; 307/451; 307/455; 307/463
[58] Field of Search ............... 307/443, 451, 455, 463, 307/449

[56] References Cited

U.S. PATENT DOCUMENTS

| | | | |
|---|---|---|---|
| 4,570,084 | 2/1986 | Griffin et al. | 307/452 |
| 4,615,010 | 9/1986 | Davis et al. | 364/491 |
| 4,638,482 | 1/1987 | Griffin et al. | 371/63 |
| 4,656,417 | 4/1987 | Kirkpatrick et al. | 324/73 |
| 4,698,830 | 10/1987 | Barzilai et al. | 377/19 |
| 4,714,895 | 12/1987 | Nicollini et al. | 330/258 |
| 4,727,313 | 2/1988 | Barazilai et al. | 324/73 |
| 4,742,471 | 5/1988 | Yoffa et al. | 364/491 |

FOREIGN PATENT DOCUMENTS

| | | | |
|---|---|---|---|
| 0057033 | 4/1982 | Japan | 307/451 |

OTHER PUBLICATIONS

IBM *Technical Disclosure Bulletin* to Chu, et al., vol. 28, No. 6, Nov. 1985, pp. 2576-2577.
IBM *Technical Disclosure Bulletin* to Griffin, et al., vol. 27, No. 11, Apr. 1985, pp. 6529-6530.
IBM *Technical Disclosure Bulletin* to Miersch, et al., vol. 27, No. 11, Apr. 1985, pp. 6789-6790.
IBM *Technical Disclosure Bulletin* to Craig, et al., vol. 27, No. 1B, Jun. 1984, pp. 667-668.
IBM *Technical Disclosure Bulletin* to Erdelyi, et al., vol. 27, No. 1B, Jun. 1984, pp. 674-675; No. 7A Dec. 1984, pp. 3791-3793.
IBM *Technical Disclosure Bulletin* to Miersch, et al., vol. 27, No. 10B, Mar. 1985, p. 6017.

*Primary Examiner*—Stanley D. Miller
*Assistant Examiner*—Margaret Rose Wambach
*Attorney, Agent, or Firm*—Jeffrey S. LaBaw

[57] ABSTRACT

A static, single-ended cascode voltage switch logic system arranged in a tree with multiple levels. Each level of each branch of the tree is comprised of a complementary pair. The invention is preferably implemented in CMOS, so that each complementary pair consists of a p-type and an n-type transistor, the p-type FET connected at its source to a high voltage reference and at its drain to the drain of the n-type FET. The source of the n-type FET is connected to the common drain connections of the next lower-level complementary pair, or to a low voltage reference. The approach eliminates the need for passive loads, clocked loads or complementary signals, since each node is actively held high or low.

10 Claims, 5 Drawing Sheets

FULLY STATIC CMOS CASCODE VOLTAGE SWITCH LOGIC SYSTEMS

TECHNICAL FIELD

This invention relates to circuit logic systems and more particularly, to an unclocked, static, single ended logic system of the cascode voltage switch type.

BACKGROUND ART

Logic systems of the single ended cascode voltage switch (CVS) type, also called cascode current switch (CCS) logic, are described in the commonly assigned U.S. Pat. No. 4,591,993, to W. R. Griffin and L. G. Heller. These circuits are generally made in the complementary metal oxide semiconductor (CMOS) technology having an N channel transistor, matrix as a logic system using a P channel transistor matrix as a complementary logic network.

The cascode voltage switch type logic system may also be of a differential type as disclosed in commonly assigned U.S. Pat. No. 4,638,482, to J. W. Davis and N. G. Thoma. However, in differential CVS circuits, each CVS logic function has two outputs, True and Complement, and therefore uses twice the AC power and twice the wiring channels that single-ended CVS logic would use.

FIG. 1 shows a state of the art CMOS single-ended CVS type decoder. There are two approaches to providing an up level or logical "1" at the decoder outputs. The first approach, shown in FIG. 2, is to use a passive pull-up device, or load resistor to pull unselected outputs high. There are two problems with this approach. First, the decoder is slow. The passive load must be small enough for a branch of the CVS tree to pull it to a valid low. Therefore, the decoder outputs' rise time is limited by the load current, which is determined by the number and size of the devices stacked in the branch, i.e., the beta ratio of the tree branch to the load. Second, there is DC current flow in the selected output, so there is excessive DC power dissipation.

The second approach, shown in FIG. 3, is to precharge the outputs to Vdd by clocking an active device, turn the clocked devices off which floats the outputs, and then either enable the CVS tree or enable the decoded inputs so the selected output is pulled low. This approach also has two problems. First, it requires clocks for timing. Second, since unselected nodes float during decode this clocked, or dynamic, CVS tree is unusable in radiation hardened applications. Device count is 46.

The present invention overcomes the above limitations of prior CVS type circuits.

SUMMARY OF THE INVENTION

It is therefore an object of the invention to improve the wireability of the CVS tree by using single-ended logic.

It is another object of the invention to minimize DC power consumption.

It is yet another object of the invention to eliminate the need for external control or clocks.

It is still another object of the invention to radiation harden a CVS logic circuit.

It is still yet another object of the invention to maintain a fixed steady-state voltage potential at all non-input internal and external CVS nodes.

These and other objects are accomplished by an unclocked, static, single-ended, CMOS CVS tree. As the tree is entirely CMOS, there is no DC current path and therefore, no DC power loss. Each level of each branch of the CVS circuit is comprised of a complementary pair, a p-type and an n-type transistor, the p-type FET connected at its source to the high voltage reference and at its drain to the drain of the n-type FET. The source of the n-type FET is connected to the common drain connections of the next lower-level complementary pair of p-type and n-type FETs. The source of the n-type FET of lowest level complementary pair is connected to the low voltage reference. In operation, the complementary pair act as two complementary switches, one always open, one always closed. If the gate voltage is low to the pair, the n-type transistor is off, i.e., open, and the p-type transistor is on, i.e., closed. The common drain connection will be connected through the p-type transistor to the higher reference voltage, and therefore, held high. If the gate voltage is high to the pair, the p-type transistor will be off and the n-type transistor will be on. The common drain connection will be connected to the n-type transistor's source, and will be held high or low with the source. This approach eliminates the need for passive loads, clocked loads or complementary signals, since every node is actively held high or low.

DETAILED DESCRIPTION OF THE DRAWINGS

Figure 1:
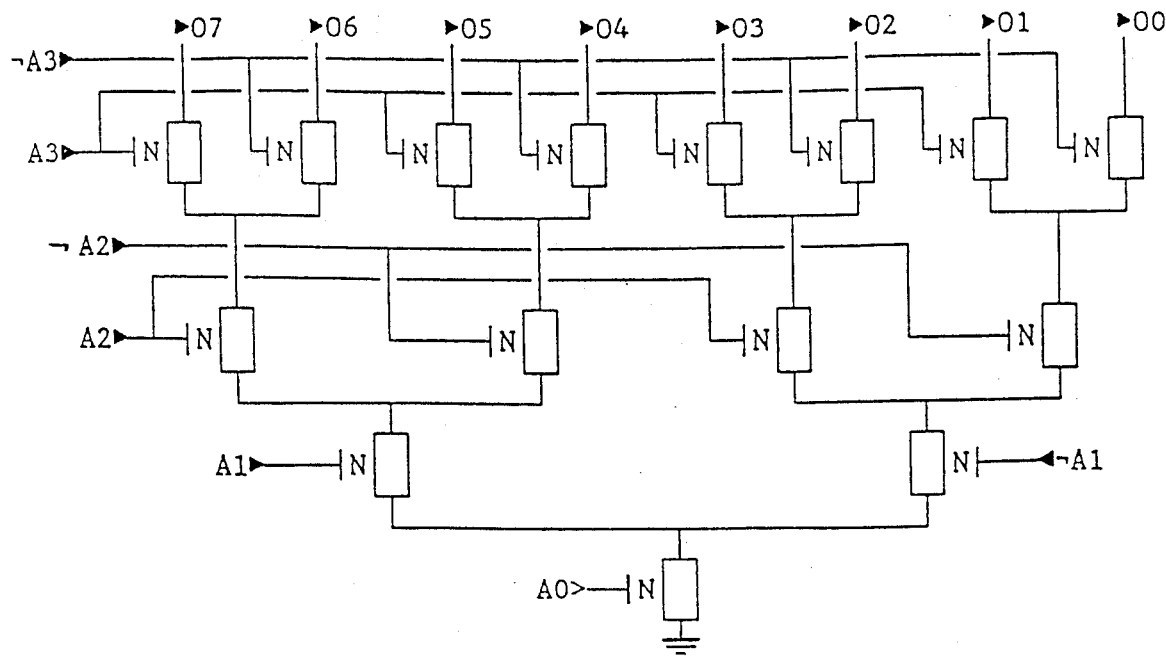
FIG. 1 is a circuit diagram of a prior art CVS CMOS decoder.
Figure 2:
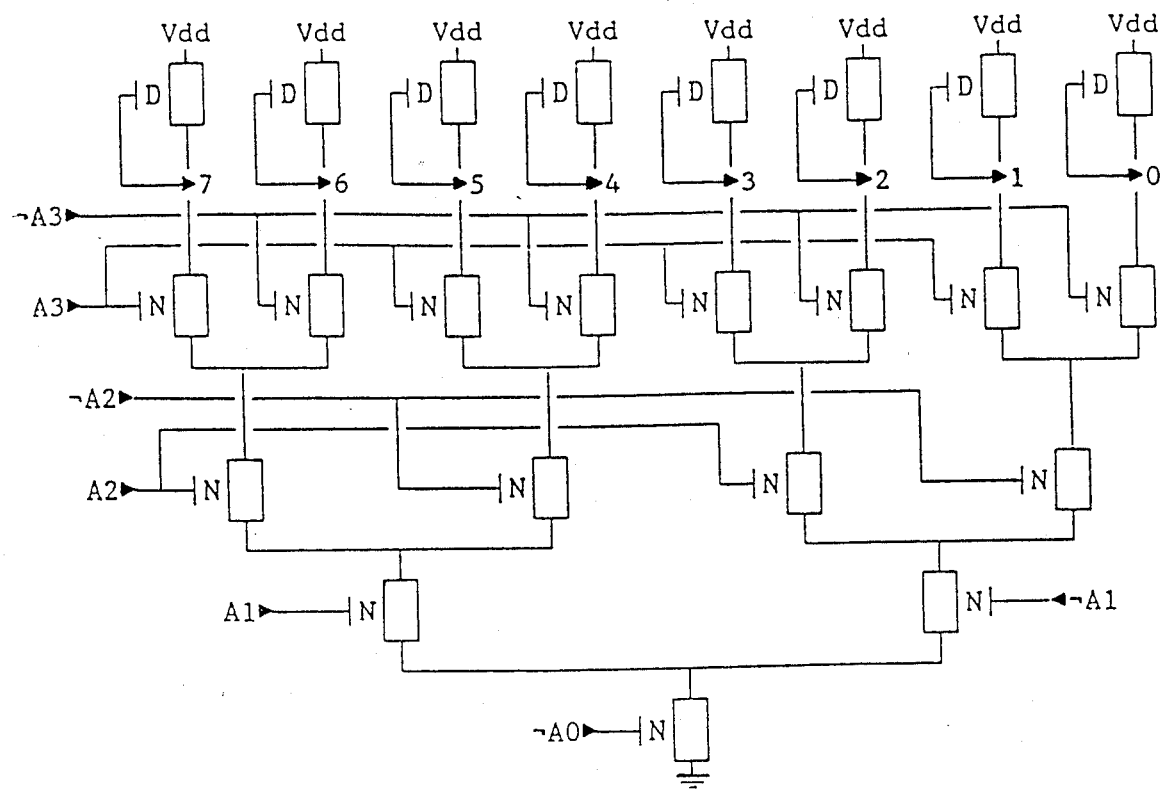
FIG. 2 is a circuit diagram of a prior art CVS CMOS decoder which uses passive pull-up device to pull the unselected outputs high.
Figure 3:
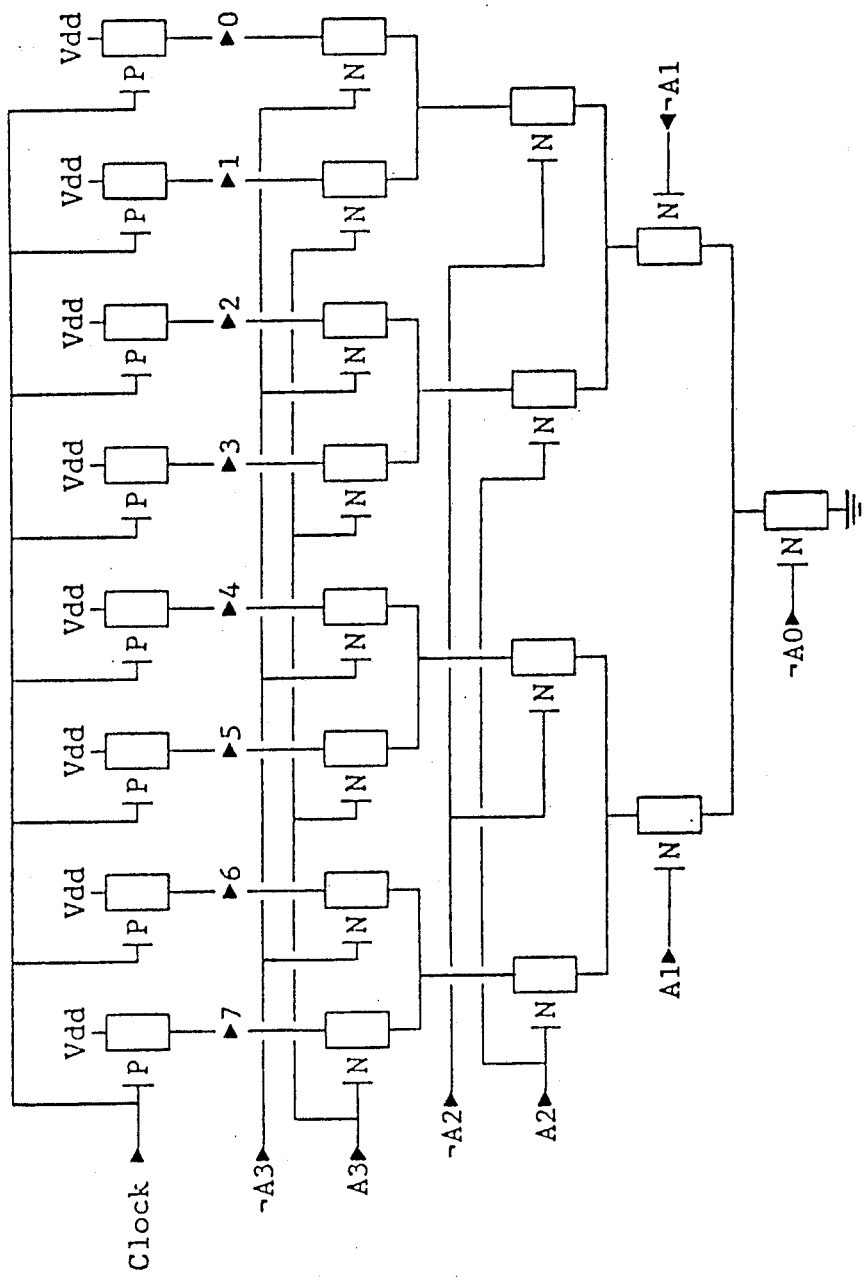
FIG. 3 is a circuit diagram of a prior art CVS CMOS decoder which uses a clocked active device to precharge the outputs to Vdd.
Figure 4:
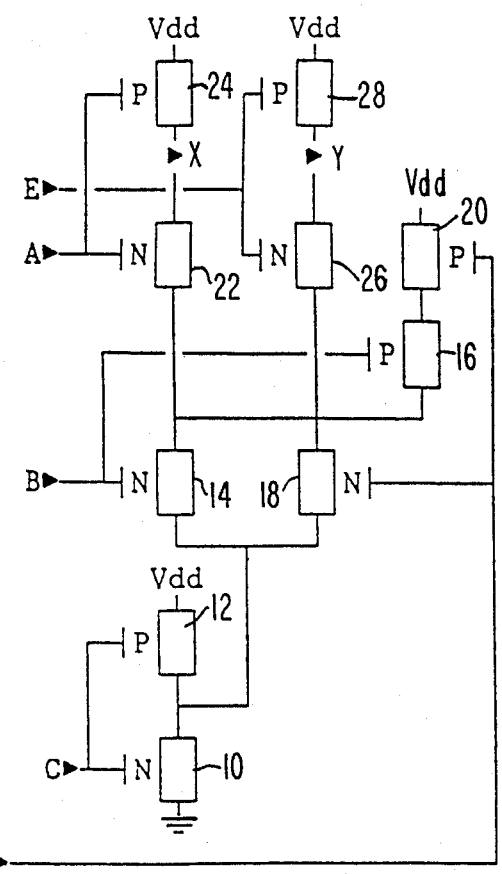
FIG. 4 is a circuit diagram of a CMOS CVS logic tree with two branches to provide an And-Or-Invert function designed in accordance with the principles of the present invention.

Referring to FIG. 4, a simple three level CVS logic circuit, with two branches to provide an And-Or-Invert function, designed according to the principles of the present invention is shown. The circuit has five inputs, A, B, C, D and E and two outputs X and Y, and performs the logical operations X=A & (B+D) & C and Y=$\overline{\text{E}}$ & $\overline{\text{(B+D)}}$ & $\overline{\text{C}}$. The circuit tree is arranged in multiple levels and two branches, where most levels of each branch are comprised of a complementary pair of a p-type and an n-type CMOS FET. In each complementary pair, the p-type FET is connected at its source to the high voltage reference, Vdd, and at its drain to the drain of the n-type FET of the pair. The source of the n-type FET is connected to the common drain connections of the next lower level complementary pair, or to the low voltage reference Gnd. In FIG. 4, the lowest level complementary pair consists of n-type transistor 10 and p-type transistor 12. The source of transistor 10 is coupled to ground, the source of transistor 12 is coupled to Vdd, and the drains of both transistors 10 and 12 are coupled together.

The next level of the circuit illustrates a minor variation to the present invention. Rather than being arranged in two complementary pairs, transistors 14, 16, 18 and 20 form a simple NOR function. In the NOR function, the sources of both n-type transistors are connected to the common drain connection of the next lower level complementary pair, transistors 10 and 12. The source of one of the P-type transistors, transistor 20, is coupled to the high reference voltage. The drains of n-type transistors 14 and 18 are coupled to the drain of p-type transistor 16. According to the principles of the present invention, any of the levels of the CVS tree can be replaced with a NOR function which will vary in width according to how many branches are in that level of the tree. In these NOR functions, the sources of all of the n-type transistors will be coupled to the common drain connections of the next lower level of the CVS tree and at least one of the p-type transistors will be connected to the high voltage reference.

The third and highest level of the circuit in FIG. 4 comprises two more complementary pairs, the first pair consisting of n-type transistor 22 and p-type transistor 24, and the second pair consisting of n-type transistor 26 and p-type transistor 28. The drain of each transistor in the complementary pair is connected to the drain of its complementary transistor. The sources of p-type transistors 24 and 28 are connected to Vdd and the sources of the n-type transistors 22 and 26 are connected to the common drain connection of the next lowest level, transistors 14 and 18, and transistor 16.

In operation, all of the selected nodes of the circuit, the outputs will be forced low, when all of the n-type transistors are turned on, or selected, thus providing a path to the lower reference voltage, Gnd. When the n-type transistors are turned on, the complementary p-type transistors are off. Without the complementary p-type transistors in the circuit tree where the n-type transistors are off, the deselected nodes would float since they would not be driven to either the higher or lower reference voltage. Radiation or high temperature can cause leakage in the transistors, and as a result, the leakage will pull the floating nodes low in a short time. This can lead to serious errors in a high radiation or temperature environment such as found in space application. The use of the p-type transistors will hold the outputs of a deselected branch high to prevent the leakage errors.

CMOS is called "ratioless" as a designer does not have to consider the ratio of widths of the pull up device to the pull down device to achieve an adequate down level. The widths of the pull up and pull down devices become a design constraint of a passive load technology because of DC power limits and adequate output down levels, which require tradeoffs in performance to meet those constraints. Static CMOS logic is equivalent in performance to dynamic logic because circuit performance is not constrained by the power or down level constraints inherent in passive load static logic.

Figure 5:
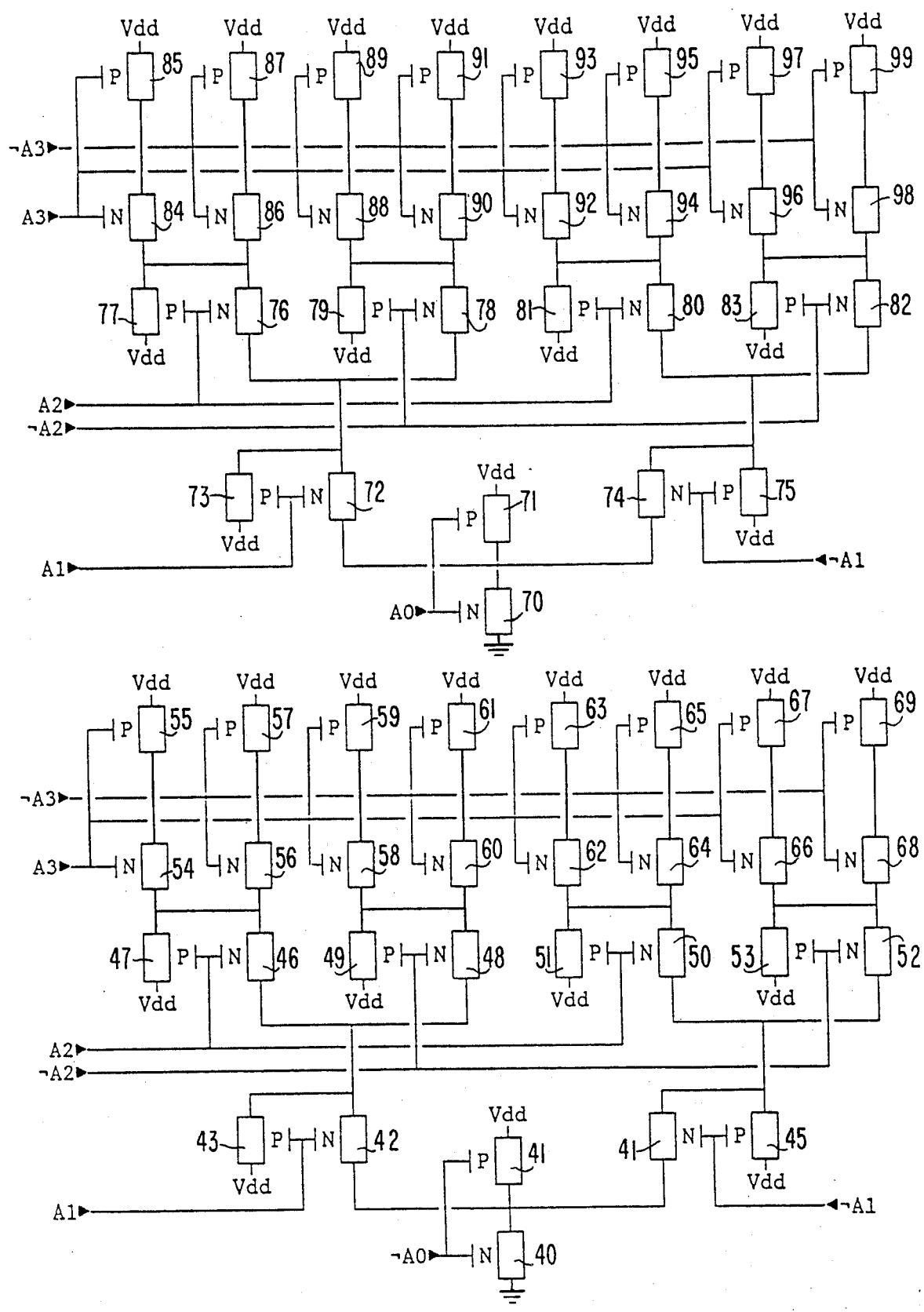
FIG. 5 is a circuit diagram of a CMOS CVS 4 to 16 decoder built in accordance with the principles of the present invention.

FIG. 5 shows a fully static CMOS CVS 4 to 16 decoder built according to the principles of the present invention with four levels. The circuit has eight inputs labelled A0, $\overline{A0}$, A1, $\overline{A1}$, A2, $\overline{A2}$, A3 and $\overline{A3}$ and sixteen outputs labelled X0, X1, ... to XF to correspond to the number 0 through 15 in hexadecimal notation. The organization of the first half of the circuit, comprised of transistors 40 through 69 provides the first eight outputs of the decoder is as follows: The lowest level complementary pair, transistors 40 and 41, accepts input from A0. The source of n-type transistor 40 is connected to ground, and the source of p-type transistor is connected to Vdd and the two transistor drains are connected to each other.

The next level of the circuit is comprised of transistor pair 42 and 43 and transistor pair 44 and 45. The sources of n-type transistors 42 and 44 are connected to the common drain connection of transistors 40 and 41, the sources of p-type transistors 43 and 45 are connected to Vdd and the drains of the transistors making up each complementary pair are connected to each other.

The third level of the circuit is comprised of complementary transistor pairs 46 and 47, 48 and 49, 50 and 51, and 52 and 53. The sources of p-type transistors 47, 49, 51 and 53 are connected to Vdd, the sources of n-type transistors 46, 48, 50 and 52 are connected to the common drain connection of either transistors 42 and 43 or 44 and 45 and the drains of the transistors in each complementary pair are connected to each other. The fourth and highest level of the circuit is comprised of the eight complementary pairs made of transistors 54 through 69. In all these complementary pairs, the sources of the p-type transistors are connected to Vdd, the sources of the n-type transistors are connected to the common drain connection of one of the complementary pairs in the third level of the circuit tree, and the drains of the transistors which make up each complementary pair are connected to each other. The devices in the second half of the circuit, transistors 70–99, provide outputs X8 through XF and are connected in an identical manner to transistors 40–69.

In the CVS logic circuit shown in FIG. 5, there is no DC current path. In addition, in the preferred embodiment ratioless CMOS logic is used giving the circuit a performance equal to a dynamic CVS current without the need for extra clocks. The total device count, 60, is slightly higher than in dynamic CVS, however, the deselected nodes in a dynamic CVS circuit are not always held to either the higher or lower level voltage level which leads to the leakage problems discussed above. In the static CVS 4 to 16 decoder in FIG. 5, both the selected and deselected nodes are actively driven. The P-type transistors will drive the output to Vdd or Vdd - Vt depending on where in the branch the deselect occurs.

Table 1 describes the relationship between the inputs to and outputs from the CVS decoder shown in FIG. 5. For example, when A0, A1, A2 and A3 are low, or at logical "0", the output at X0 is low, or logical "0", signifying selection, while all the rest of the outputs are high. When A0, A1, A2 and $\overline{A3}$ are low, the output at X1 is low, while the remainder of the outputs are held high.

TABLE 1

| $\overline{A}A\overline{A}A\overline{A}A\overline{A}A$ | XXXXXXXXXXXXXXXX |
|---|---|
| 0 0 1 1 2 2 3 3 | 0 1 2 3 4 5 6 7 8 9 A B C D E F |
| 0 1 0 1 0 1 0 1 | 0 1 1 1 1 1 1 1 1 1 1 1 1 1 1 1 |
| 0 1 0 1 0 1 1 0 | 1 0 1 1 1 1 1 1 1 1 1 1 1 1 1 1 |
| 0 1 0 1 1 0 0 1 | 1 1 0 1 1 1 1 1 1 1 1 1 1 1 1 1 |
| 0 1 0 1 1 0 1 0 | 1 1 1 0 1 1 1 1 1 1 1 1 1 1 1 1 |
| 0 1 1 0 0 1 0 1 | 1 1 1 1 0 1 1 1 1 1 1 1 1 1 1 1 |
| 0 1 1 0 0 1 1 0 | 1 1 1 1 1 0 1 1 1 1 1 1 1 1 1 1 |

TABLE 1-continued

| $\overline{A}\overline{A}\overline{A}\overline{A}AAAA$ | XXXXXXXXXXXXXXXX |
|---|---|
| 0 0 1 1 2 2 3 3 | 0 1 2 3 4 5 6 7 8 9 A B C D E F |
| 0 1 1 0 1 0 0 1 | 1 1 1 1 1 1 0 1 1 1 1 1 1 1 1 1 |
| 0 1 1 0 1 0 1 0 | 1 1 1 1 1 1 1 0 1 1 1 1 1 1 1 1 |
| 1 0 0 1 0 1 0 1 | 1 1 1 1 1 1 1 1 0 1 1 1 1 1 1 1 |
| 1 0 0 1 0 1 1 0 | 1 1 1 1 1 1 1 1 1 0 1 1 1 1 1 1 |
| 1 0 0 1 1 0 0 1 | 1 1 1 1 1 1 1 1 1 1 0 1 1 1 1 1 |
| 1 0 0 1 1 0 1 0 | 1 1 1 1 1 1 1 1 1 1 1 0 1 1 1 1 |
| 1 0 1 0 0 1 0 1 | 1 1 1 1 1 1 1 1 1 1 1 1 0 1 1 1 |
| 1 0 1 0 0 1 1 0 | 1 1 1 1 1 1 1 1 1 1 1 1 1 0 1 1 |
| 1 0 1 0 1 0 0 1 | 1 1 1 1 1 1 1 1 1 1 1 1 1 1 0 1 |
| 1 0 1 0 1 0 1 0 | 1 1 1 1 1 1 1 1 1 1 1 1 1 1 1 0 |

Figure 6:
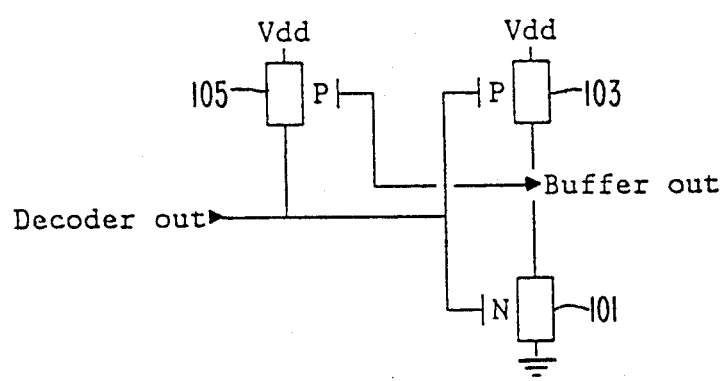
FIG. 6 is a circuit diagram of output buffer which can be added to the 4 to 16 decoder of FIG. 5.

A full Vdd up level can be guaranteed on all unselected outputs by adding the output buffer circuit of FIG. 6 to the 4 to 16 decoder output. As shown in FIG. 6, the buffer circuit comprises a complementary pair, n-type transistor 101 having its source connected to ground and p-type transistor 103 having its source connected to Vdd, and p-type transistor having its source connected to Vdd, its drain connected to the decoder output and the common gate connections of transistors 101 and 103 and its gate connected to the common drain connection of the complementary pair which is also the buffer output. The 4 to 16 decoder in FIG. 5 is fully functional without the buffer, and as each output is actively held high or low, it is useable in high radiation or high temperature. However, without the buffer, the output may not be at Vdd, causing a parasitic DC current through the next logic stage, because the P-type transistor in that stage will not be turned completely off. However, while in other embodiments of the invention the parasitic DC current may cause significant problems, this parasitic current will not be sufficient to prevent the proper operation of the circuit as a decoder.

Figure 7:
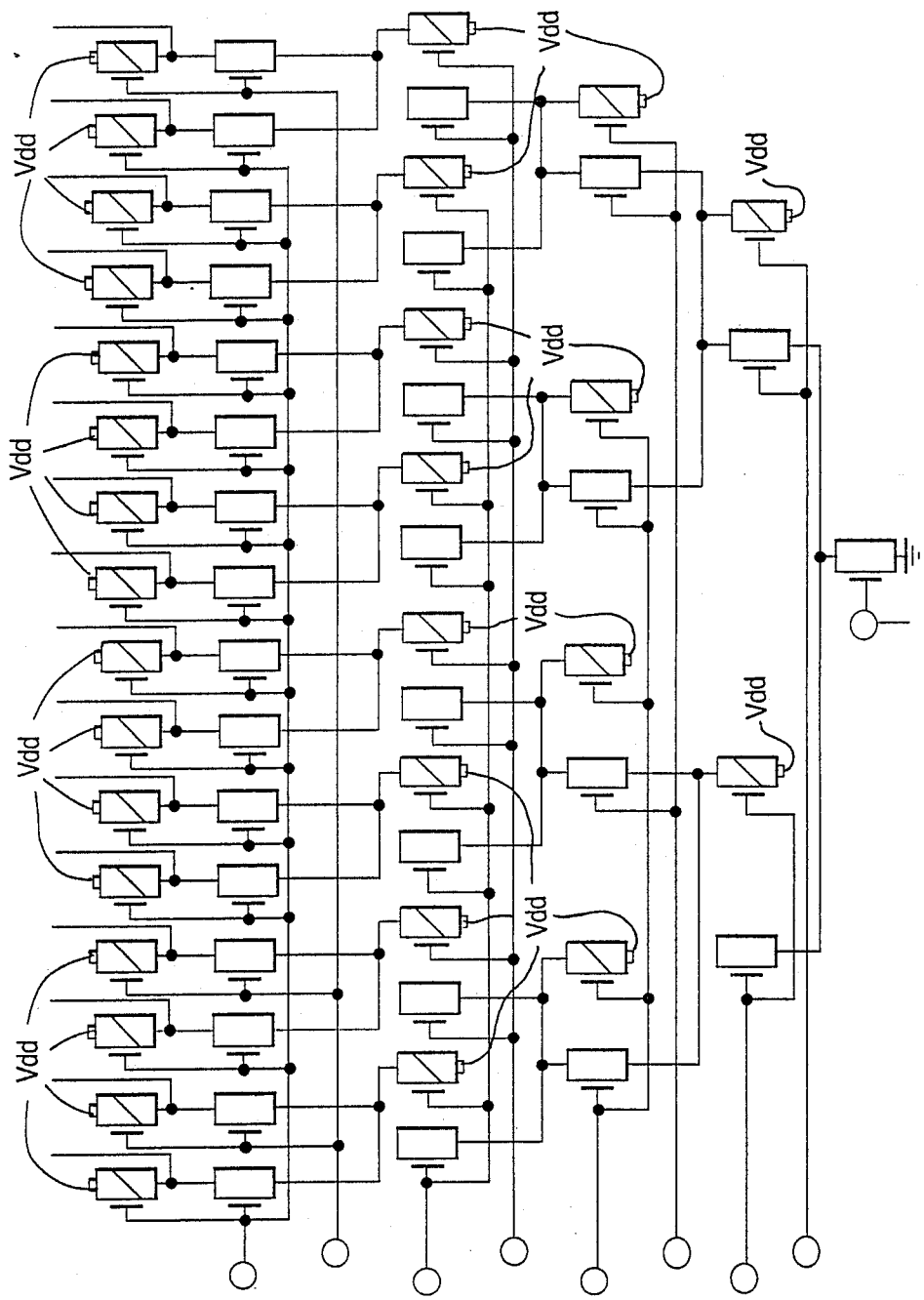
FIG. 7 is a circuit diagram of clocked 4 to 16 decoder built in accordance with the principles of the present invention.

In FIG. 7, another embodiment of the invention is depicted. This FIG. shows a 4 to 16 Clocked Decoder, wherein the complementary pairs are connected as those in the 4 to 16 Decoder in FIG. 5, but with a clocked or enable device coupled to ground. Therefore, the Clocked Decoder is enabled only when the clock is on. This type of circuit is useful for synchronous operation with external timing such as in a RAM decode circuit.

In summary, the fully static CVS decoder: is much smaller and faster than conventional state of the art decoders; has no DC power dissipation; requires no extra external control logic or clocks; and is radiation hardened. While this disclosure details a 4 to 16 decoder and other preferred embodiments, the same technique is applicable to any CVS logic circuit.

While the invention has been described with respect to particular preferred embodiments, it would be understood by those skilled in the art that modifications may be made without departing from the spirit and scope of the present invention. In general, any Boolean equation with 'n' variables can be solved with a CVS logic tree with 'n' levels; many of such CVS logic trees can be made according to the principles of this invention. Although the invention has been described with reference to static CMOS logic circuit, the invention has applicability to bipolar circuits as well by replacing the p-type and n-type FETs with pnp and npn bipolar transistors respectively. These embodiments are for the purposes of example and illustration only and are not to be taken to limit the scope of the appended claims.

We claim:

1. A CVS logic circuit tree having a plurality of connections or nodes arranged in a plurality of levels, arranged from lowest level to highest level, comprising:
   a plurality of complementary pairs arranged in said plurality of levels, each of said plurality of complementary pairs comprised of:
   a first type transistor having a first current conduction terminal, a second current condition terminal, and a control terminal;
   a second type transistor which is complementary to the first type transistor having a first current conduction terminal, a second current conduction terminal, and a control terminal; said first current conduction terminal of said first type transistor is coupled to a first voltage reference and said second current conduction terminal of said first type transistor is coupled to said second current conduction terminal of said second type transistor at a common node and wherein the control terminals of said first and second type transistors in each complementary pair are coupled to a common input;
   said first current conduction terminal of said second type transistor is coupled to a second voltage reference for the complementary pairs in said lowest level, but in higher levels said first current conduction terminal of said second type transistor is coupled to said common node connection of the next lower level complementary pair;
   wherein all current paths between levels are through said complementary pair transistors, and whereby deselected nodes of said CVS logic circuit tree are actively driven to said first voltage reference and selected nodes of said CVS logic circuit are driven to said second voltage reference.

2. The CVS logic circuit tree as recited in claim 1, wherein said first type transistors are p-type CMOS FETs and said second type transistors are n-type CMOS FETs, and wherein said first current conduction terminals are sources of their respective FETs, said second current conduction terminals are drains of their respective FETs, and said Control terminals are gates of their respective FETs.

3. The CVS logic circuit tree as recited in claim 1, wherein said first type transistors are pnp bipolar transistors and said second type transistors are npn bipolar transistors, and wherein said first current conduction terminals are emitters of their respective bipolar transistors, said second current conduction terminals are collectors of their respective bipolar transistors, and said control terminals are bases of their respective bipolar transistors.

4. The CVS logic circuit tree as recited in claim 1, wherein a plurality of outputs of said CVS logic circuit are taken from the common node connections of complementary pairs in said highest level.

5. The CVS logic circuit tree as recited in claim 2, wherein a plurality of said CVS logic circuit are taken from the common node connections of complementary pairs in said highest level.

6. The CVS logic circuit tree as recited in claim 3, wherein said CVS logic circuit is a decoder.

7. The CVS logic circuit tree as recited in claim 4, which further comprises a plurality of output buffer circuits each of which is connected to an output of said CVS logic tree.

8. The CVS logic circuit tree as recited in claim 7, wherein each of said plurality of output buffer circuits is comprised of a complementary pair including a p-type transistor and n-type transistor, wherein said source of said p-type transistor is connected to said high voltage reference, the source of said n-type transistor is connected to said low voltage reference the drains of said p-type transistor is connected to the drain of said n-type transistor and the gates of said p-type transistor and said n-type transistor are connected to the decoder output.

9. The CVS logic circuit tree as recited in claim 2, which further comprises a NOR function, comprised of n-type transistors and p-type transistors, wherein said NOR function is a single level of said CVS logic circuit tree, the sources of all of said n-type transistors of said NOR function are coupled to the common drain connection of the next lower level complementary pair and the source of at least one of said p-type transistors of said NOR function is connected to a high voltage reference.

10. The CVS logic circuit tree as recited in claim 1, wherein said first voltage reference is a high voltage reference and said second voltage reference is a low voltage reference.

* * * * *